Figure 1:
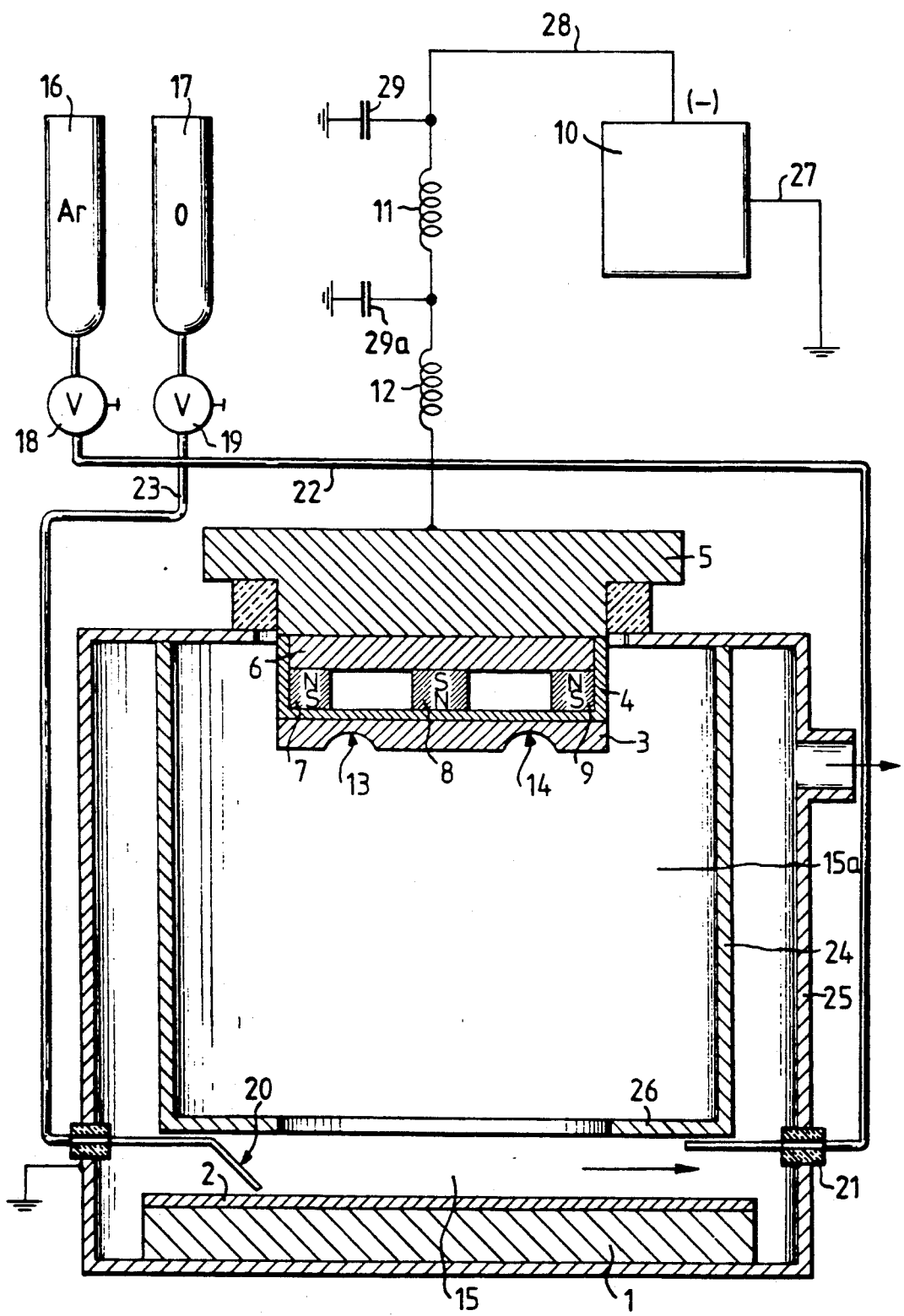

United States Patent [19]
Ludwig et al.

[11] Patent Number: 5,108,571
[45] Date of Patent: Apr. 28, 1992

[54] PROCESS FOR COATING A DIELECTRIC SUBSTRATE WITH COPPER

[75] Inventors: Rainer Ludwig, Karlstein; Rolf Adam, Hanau, both of Fed. Rep. of Germany; Anton Dietrich, Triesen, Liechtenstein; Reiner Kukla, Hanau, Fed. Rep. of Germany

[73] Assignee: Leybold Aktiengesellschaft, Hanau, Fed. Rep. of Germany

[21] Appl. No.: 770,772

[22] Filed: Oct. 4, 1991

Related U.S. Application Data

[63] Continuation of Ser. No. 445,779, Dec. 4, 1989, abandoned.

Foreign Application Priority Data

Aug. 16, 1989 [DE] Fed. Rep. of Germany ....... 3926877

[51] Int. Cl.$^5$ .................................................. C23C 14/34
[52] U.S. Cl. ..................... 204/192.13; 204/192.15; 204/192.22; 204/298.03; 204/298.07; 204/298.24
[58] Field of Search ............... 204/192.14, 192.15, 204/192.17, 192.22, 298.07, 298.03, 298.24, 192.13

[56] References Cited

U.S. PATENT DOCUMENTS 4,283,260 8/1981 Thomas et al. ............ 204/192.15 X
4,302,498 11/1981 Faith, Jr. ..................... 204/192.15 X
4,608,243 8/1986 Sproul ........................ 204/192.15 X

FOREIGN PATENT DOCUMENTS 1225940 9/1966 Fed. Rep. of Germany.
2533524B2 3/1977 Fed. Rep. of Germany.
3017713 11/1980 Fed. Rep. of Germany.

*Primary Examiner*—Nam Nguyen
*Attorney, Agent, or Firm*—Felfe & Lynch

[57] ABSTRACT

In a process for coating substrates 1, 35, for example aluminum ceramic plates 1 or polyimide films 35 with copper by means of a device including a direct current source 10 which is connected to a sputtering cathode 5, 30, 31 disposed in a process chamber 15, 15a, 32 which can be evacuated and this cathode electrically interacts with a copper target 3, 33, 34 which can be sputtered and the sputtered particles are deposited on the substrate 1, 35 whereby the argon gas can be introduced into the process chamber 15, 15a, 32 which can be evacuated, an oxygen inlet 20, 39 is provided in addition to the argon inlet 21, 40, whereby the supply of oxygen can be controlled via a valve 19, 43 inserted in the feed line 23, 39 and the amount of oxygen can be metered such that during a first process phase a copper oxide layer which functions as a bonding agent forms on the substrate 1, 35 and after adjusting the argon atmosphere in the process chamber 15, 15a, 32 pure copper is deposited as an electrically conductive layer.

3 Claims, 2 Drawing Sheets

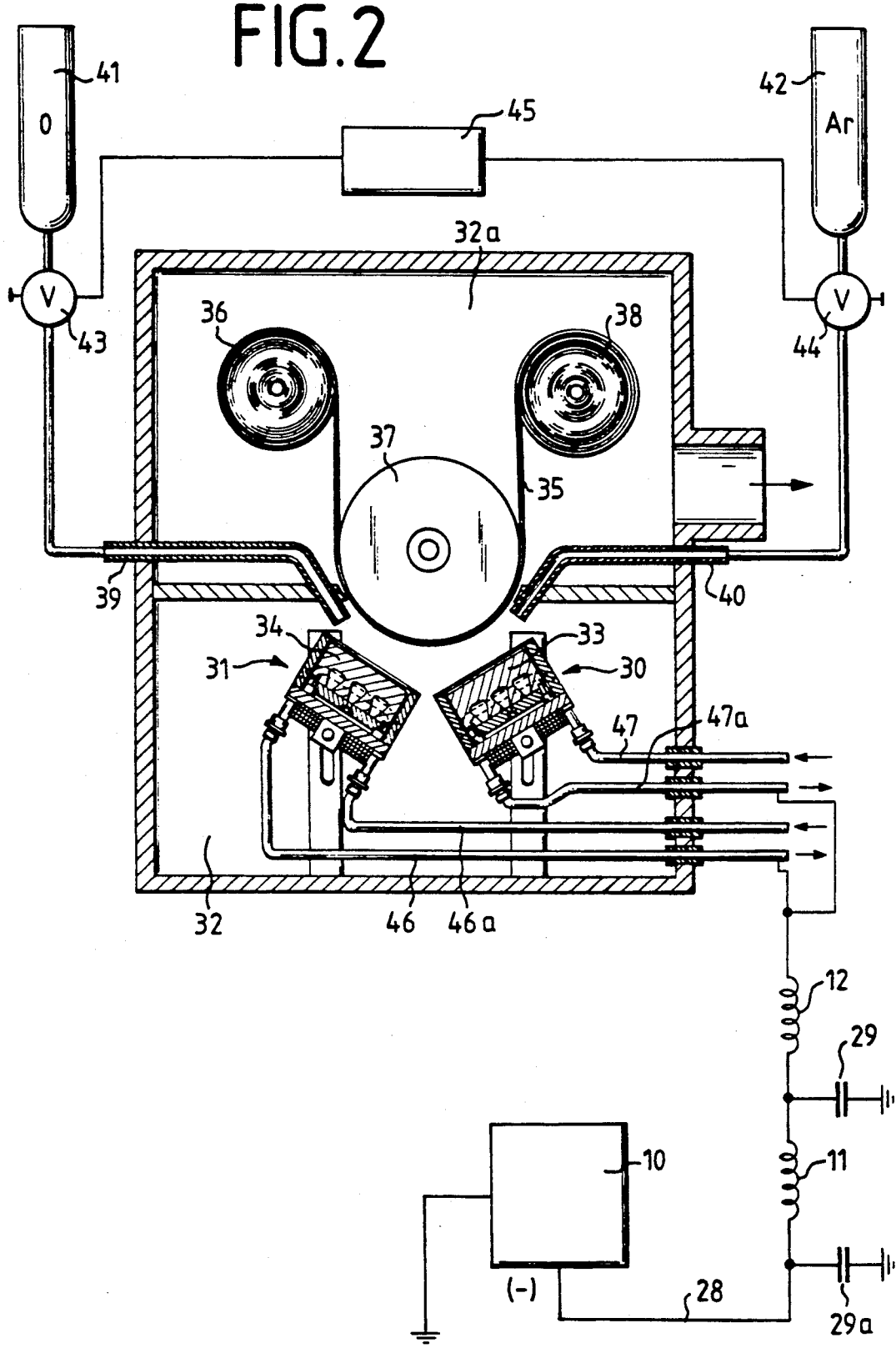

PROCESS FOR COATING A DIELECTRIC SUBSTRATE WITH COPPER

This application is a continuation of application Ser. No. 445,779, filed Dec. 4, 1989, abandoned.

The invention relates to a process for coating substrates, for example aluminum oxide ceramic plates or polyimide films with copper by means of a device which includes a direct current source connected to at least one sputtering cathode disposed in a process chamber which can be evacuated. This sputtering cathode interacts with a copper target which can be sputtered and whose sputtered particles are deposited on the substrate whereby argon gas can be introduced into said process chamber.

It is known to use so-called printed circuit boards, pieces of aluminum oxide or plastic cut to length as a carrier plate for electric circuits. In a first operational step, these pieces are coated with a bonding agent made of titanium and, in a second operational step, they are coated with copper as an electrical conductor by means of a sputtering process. Subsequently, the copper layer is covered with photo-resist and after undergoing a photo-technical process, it is etched in baths, e.g. hydrofluoric acid.

On the one hand, this conventional process has the disadvantage of being time-consuming and, hence, expensive and, on the other hand, it is a disadvantage that traces of chemicals often remain on the finished plate which renders the board or the finished circuit board useless.

It is hence an object of the invention to provide a process for coating a carrier board or carrier film, particularly for electrical circuits wherein a layer of bonding agent of titanium can be omitted and wherein the electrically conductive layer and the layer of bonding agent can be applied onto the substrate in one single operational step.

Moreover, the bonding capacity of the copper layer to be sputtered onto the substrate must be substantially improved without rendering conventional or already available devices or systems unfit for this purpose or involving essential or expensive modifications or changes.

This object is achieved in that an oxygen inlet is provided in addition to the argon inlet. The oxygen supply can be controlled via a valve which is inserted in the feed line and the amount of oxygen is measured such that during the first process phase a copper oxide layer develops which acts as a bonding agent. After adjusting the argon atmosphere, pure copper is deposited thereon as an electrically conductive layer.

The invention permits the most various embodiments one of which is diagrammatically represented in further detail in the enclosed drawing. Referring now to the Figures.

FIG. 1 is a diagram of a sputtering system for coating plate-like substrates by means of an cathode and FIG. 2 is a diagram of a sputtering system including two cathodes for the coating of strips.

The drawing (FIG. 1) shows a substrate 1 in the form of a plate made of $Al_2O_3$ which is to be coated with a thin, electrically conductive copper layer 2. Opposite this substrate 1 there is a copper target 3 to be sputtered. The target 3 is connected to an electrode 5 via an element 4 which has a U-like cross section. The electrode rests on a yoke 6 and three permanent magnets 7, 8, 9 are included between the yoke and the element 4. The polarities of the poles of the three permanent magnets which are directed toward the target 3 alternate such that the south poles of the two outer permanent magnets 7, 9, respectively, form together with the north pole of the center permanent magnet 8 an approximately circular magnetic field across the target 4. This magnetic field compresses the plasma before the target 3 such that it reaches its greatest density at the point where the magnetic fields have their maxima. The ions in the plasma are accelerated by an electric field which is generated due to a direct voltage which is supplied by a direct current source 10. With its negative pole, this direct current source 10 is connected via two inductors 11, 12 to the electrode 5. The electric field stands vertically on the surface of the target 3 and accelerates the positive ions of the plasma in direction toward this target 3.

A more or less great number of atoms or particles is thus ejected from the target 3, particularly from the areas 13, 14 where the maxima of the magnetic fields are. The sputtered atoms or particles travel in direction toward the substrate 1 where they are deposited as a thin layer 2.

A computer for processing the data and releasing control command is provided for controlling the represented arrangement. The values of the measured partial pressure in the process chamber 15, 15a, for example, can be supplied to this process computer. Based on this and other data the computer can control the gas flow via valves 18, 19 and the gas feed lines 22, 23 and select the voltage at the cathode 5. The process computer is also capable of controlling all other variables, for example, cathode current and magnetic field strength. Since process computers of this kind are known a description of their design is omitted.

In order to improve the adhesive properties of the copper layer 2 on the plate-like substrate 1, a very thin layer of bonding agent is first applied to the surface of the substrate 1 by exposing the substrate 1 which is conveyed across the process chamber 25 in direction F to a gas mixture consisting of argon and oxygen. A portion oxygen from the cylinder 17 is metered such that it is immediately consumed to completion by the ongoing process such that, subsequently, in the process chamber 25, a pure argon atmosphere prevails in the vicinity of the substrate 1 and, correspondingly, pure copper is deposited on the layer of bonding agent consisting of copper oxide.

Coating a carrier or a substrate 1 with a copper oxide layer has two particular advantages:

1. The bonding of the pure copper layer 2 on the carrier, for example on the plate 1 is so good that electronic components (ICs, resistors, capacitors, etc.) can be soldered directly onto this layer without running the risk that the latter peel off during the process or during a later mechanical stress (surface mounted device).

2. An etching process, for example, can be applied for forming discrete printed conductors wherein the treatment of the workpiece in several baths with strongly etching liquids (e.g. hydrofluoric acid) can be omitted.

The embodiment of FIG. 2 is a strip coating system which has two electrodes 30, 31 in a coating chamber 32 from the targets 33, 34 of which copper is simultaneously sputtered off while the strip-like substrate 35 is reeled off a roll 36 and via coating drum 37 it is reeled onto a take-up roll. In the area of the cathode 34 a gas inlet pipe 39 ends out via which oxygen can be introduced from the gas supply cylinder 41 into the area of the cathode 31. From the supply cylinder 42 argon is supplied via a second gas inlet pipe 40 into the process chamber 32. During the coating process, an electronic control circuit 45 causes amounts of gas to be introduced while metered such that, on the one side, only copper oxide is deposited on the strip-like substrate 35 in the area of the first cathode 31 and pure copper in the area of the second cathode 30.

For a better understanding of the system in accordance with FIG. 2, it be noted that the targets 30 and 31 are placed on supports where they can be moved and that they are connected to tubes 46, 46a and 47, 47a carrying a cooling liquid and simultaneously supplying electric power to the targets and the magnets thereof from a direct current source 10. It is understood that for controlling the gas supply, the electronic control 45 requires a number of additional parameters (which are omitted for reasons of clarity) and therefore it is connected to a power source and sensors, sensing the pressure in the process chamber, for example. It is essential to the invention that the amount of supplied oxygen and supplied argon during the formation of the adhesive layer be in the right proportion to one another and also correctly adjusted to the speed of the passing strip and the flow of sputtered particles.

What is claimed is:

1. A process for coating substrates with copper comprising:
    cathode-sputtering a copper target on a substrate moving from an entrance with respect to a sputtering cathode to an exit with respect thereto by introducing near said exit argon gas into a process chamber which can be evacuated;
    providing an oxygen inlet near said entrance in addition to an argon inlet near said exit;
    controlling a supply of oxygen via a valve in an oxygen feed line; and
    metering the amount of oxygen such that said amount of oxygen is immediately consumed to completion during a first process phase and a copper oxide layer which functions as a bonding agent forms on the substrate and during a second process phase in an argon atmosphere in at least a portion of the process chamber pure copper deposits as an electrically conductive layer.

2. A process in accordance with claim 1 in which the second process phase includes adjusting the argon atmosphere in the process chamber.

3. A process in accordance with claim 1 in which the second process phase includes introducing the argon atmosphere in a portion of the process chamber.

* * * * *